(12) United States Patent
Huang et al.

(10) Patent No.: US 9,349,748 B2
(45) Date of Patent: May 24, 2016

(54) METHOD FOR FORMING DEEP TRENCH ISOLATION FOR RF DEVICES ON SOI

(71) Applicant: SEMICONDUCTOR MANUFACTURING INTERNATIONAL (SHANGHAI) CORPORATION, Shanghai (CN)

(72) Inventors: Herb He Huang, Shanghai (CN); Haiting Li, Shanghai (CN); Xingcheng Jin, Shanghai (CN); Xinxue Wang, Shanghai (CN); Hongbo Zhao, Shanghai (CN); Fucheng Chen, Shanghai (CN); Yanghui Xiang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/564,081

(22) Filed: Dec. 8, 2014

(65) Prior Publication Data
US 2015/0187794 A1 Jul. 2, 2015

(30) Foreign Application Priority Data
Dec. 27, 2013 (CN) .......................... 2013 1 0743202

(51) Int. Cl.
| H01L 21/84 | (2006.01) |
| H01L 21/762 | (2006.01) |
| H01L 27/12 | (2006.01) |
| H01L 29/06 | (2006.01) |

(52) U.S. Cl.
CPC ...... *H01L 27/1203* (2013.01); *H01L 21/76224* (2013.01); *H01L 21/84* (2013.01); *H01L 29/0653* (2013.01)

(58) Field of Classification Search
CPC . H01L 21/84; H01L 21/762; H01L 21/76224; H01L 27/12; H01L 27/1203; H01L 29/06; H01L 29/0653; H01L 21/56; H01L 21/823807; H01L 21/0254; H01L 21/02532; H01L 21/0262; H01L 21/02458; H01L 21/02381; H01L 21/268; H01L 21/2026; H01L 21/26506; H01L 21/26513
USPC ..................... 438/85, 149, 197, 311, 479, 517
See application file for complete search history.

(56) References Cited

U.S. PATENT DOCUMENTS

| 2007/0228432 A1* | 10/2007 | Ishihara ................. G11C 11/22 257/295 |
| 2008/0212376 A1* | 9/2008 | Park .................... G11C 11/5621 365/185.29 |
| 2011/0309333 A1* | 12/2011 | Cheng .................... B82Y 10/00 257/24 |

(Continued)

*Primary Examiner* — Chuong A Luu
(74) *Attorney, Agent, or Firm* — Kilpatrick Townsend and Stockton LLP (57) ABSTRACT

A semiconductor device includes a silicon-on-insulator (SOI) substrate having a stack of a first semiconductor substrate, a buried insulating layer and a second semiconductor substrate formed in a first region and a deep trench isolation disposed in a second region. The method of forming the semiconductor device includes providing a SOI substrate having shallow trench isolations (STIs) and transistors formed within and on the second semiconductor substrate, respectively. The method also includes forming a hard mask over the first region and removing the STIs, the transistors, the second semiconductor substrate and the buried insulating layer in the second region using the hard mask as a mask, and forming a capping layer covering the deep trench isolation and the second semiconductor substrate including the transistors.

10 Claims, 9 Drawing Sheets

(56) References Cited

U.S. PATENT DOCUMENTS

| | | | | |
|---|---|---|---|---|
| 2012/0228711 A1* | 9/2012 | Hoshino | ............ | H01L 27/1203 257/368 |
| 2013/0105870 A1* | 5/2013 | Tateshita | ........... | H01L 21/82345 257/292 |
| 2014/0312405 A1* | 10/2014 | Park | .................... | H01L 29/7881 257/316 |

* cited by examiner

METHOD FOR FORMING DEEP TRENCH ISOLATION FOR RF DEVICES ON SOI

CROSS-REFERENCES TO RELATED APPLICATIONS

The present application claims priority to Chinese patent application No. 201310743202.0, entitled "METHOD FOR FORMING DEEP TRENCH ISOLATION FOR RF DEVICES ON SOI", filed with the State Intellectual Property Office of People's Republic of China on Dec. 27, 2013, the content of which is incorporated herein by reference in its entirety.

FIELD OF THE INVENTION

The present invention relates to integrated semiconductor devices, and more particularly to a semiconductor device having a deep trench isolation structure and manufacturing method thereof.

BACKGROUND OF THE INVENTION

In the field of semiconductor technology, a RF front-end module (RF FEM) is a key component in many wireless communication devices such as mobile phones, tablet PCs, and the like. A RF switch is typically an important component of a RF front-end module. A RF switch is required to have high signal fidelity, low insertion loss, good linearity, goos switch isolation, and small signal distortion.

In the prior art, RF switches are made of gallium arsenide (GaAs) transistors, which involves expensive manufacturing and packaging parts. In recent years, with advance in semiconductor technology, RF switches can be implemented using metal oxide semiconductor field effect transistors on a silicon-on-insulator substrate (SOI MOS), and the SOI MOS RF switches can have performance levels similar to those of GaAs switches.

However, the SOI silicon thin film MOSFET transistors and metal interconnect wires may couple strongly to the buried oxide layer. If an effective RF insulation measure is not taken, then the linearity and harmonic distortion of the RF switches may be affected.

Thus, there is a need for novel techniques to solve the problems of the prior art.

BRIEF SUMMARY OF THE INVENTION

Embodiments of the present invention provide a method of forming a semiconductor device. The method includes providing a silicon-on-insulator (SOI) substrate having a first region and a second region, the SOI substrate includes a first semiconductor substrate, a buried insulating layer, and a second semiconductor substrate sequentially formed thereon. The method also includes forming a multitude of shallow trench isolation structures within the second semiconductor substrate in the first and second regions, forming a multitude of transistors on the second semiconductor substrate in the first and second regions, and forming a hard mask layer over the second semiconductor substrate. The hard mask layer includes an opening which exposes a portion of the second semiconductor substrate in the second region. The method also includes removing the transistors and shallow trench isolation structures disposed in the exposed portion of the second semiconductor substrate to form a deep trench isolation using the hard mask layer as a mask. The method further includes removing the hard mask layer, and forming a dielectric capping layer covering a bottom and sidewalls of the deep trench isolation.

In an embodiment, the method further includes forming a metal silicide layer over source/drain regions and gate electrodes of the transistors prior to forming the hard mask layer.

In an embodiment, the method includes sequentially forming the first semiconductor substrate, the buried insulating layer on the first semiconductor substrate, and the second semiconductor substrate on the buried insulating layer, forming the multitude of transistors on the second semiconductor substrate in the first and second regions, forming a metal silicide blocking layer covering the second region of the second semiconductor substrate, and forming a metal silicide layer on gate electrodes and source/drain regions of the transistors.

In an embodiment, forming the hard mask layer may include forming a hard mask material layer over the second semiconductor substrate, forming a photoresist layer on the hard mask material layer, patterning the photoresist layer to form an opening over the second region, etching the hard mask material layer using the patterned layer as a mask, and removing the patterned photoresist layer.

In an embodiment, the hard mask layer comprises amorphous carbon.

In an embodiment, the dielectric capping layer comprises silicon nitride.

In an embodiment, an ashing process is used for removing the hard mask layer. In an embodiment, the ashing process is an oxygen plasma ashing process.

In an embodiment, the method further includes, between forming the deep trench isolation and the dielectric capping layer, performing an ion implantation into a region corresponding to the deep trench isolation. The ion implantation may include argon and boron ions.

Embodiments of the present invention also provide a semiconductor device that includes a silicon-on-insulator (SOI) substrate having a first region and a second region, the SOI substrate includes a vertical stack of a first semiconductor substrate, a buried insulating layer, and a second semiconductor substrate arranged from bottom to top in the first region, respectively. The semiconductor device also includes a multitude of transistors disposed on the second semiconductor substrate, a deep trench isolation that exposes a surface of the first semiconductor substrate in the second region, and a dielectric capping layer over a bottom and sidewalls of the deep trench isolation and the second semiconductor substrate.

In an embodiment, the dielectric capping layer includes silicon nitride.

In an embodiment, each of the transistors includes a gate electrode, source/drain regions disposed on opposite of the gate electrode, and a metal silicide formed on a surface of the gate electrode and the source/drain regions.

In an embodiment, the semiconductor device further includes an ion implanted layer disposed at a bottom of the deep trench isolation.

The following detailed description together with the accompanying drawings will provide a better understanding of the nature and advantages of the present invention.

DETAILED DESCRIPTION OF THE INVENTION

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein.

First Embodiment

According to a first embodiment of the present invention, a method of manufacturing a semiconductor device will be provided. The semiconductor device may include a transistor operating as a radio frequency (RF) switch, a deep trench isolation structure and a capping layer separating a first semiconductor substrate disposed below a buried oxide and the transistor and interconnect wires on a second semiconductor substrate disposed above the buried oxide to significantly reduce coupling of the substrates and to ensure the linearity and electrical characteristics to improve the performance of the semiconductor device.

Figure 1A:
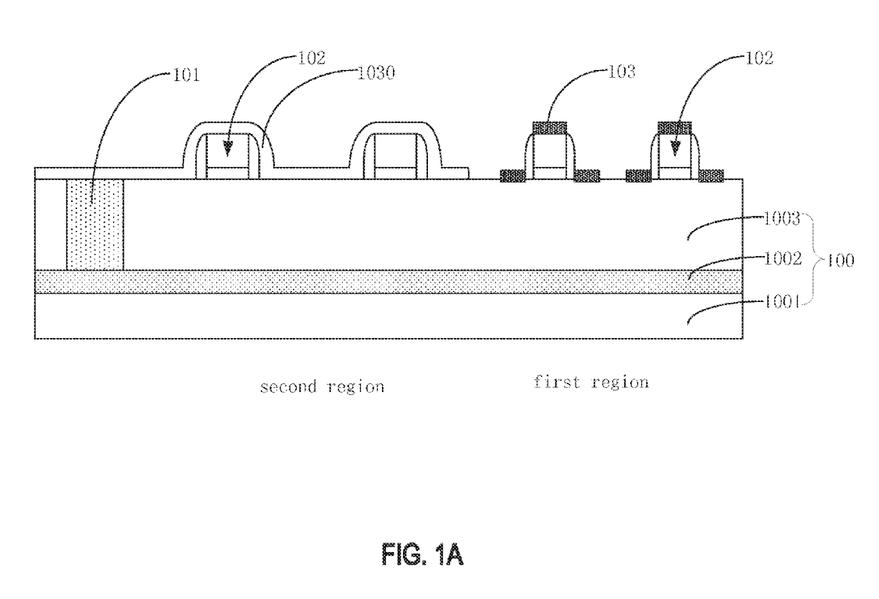
FIGS. 1A through 1G are simplified cross-sectional views illustrating intermediate process steps of a method of fabricating a semiconductor device according to an embodiment of the present invention.
Figure 1B:
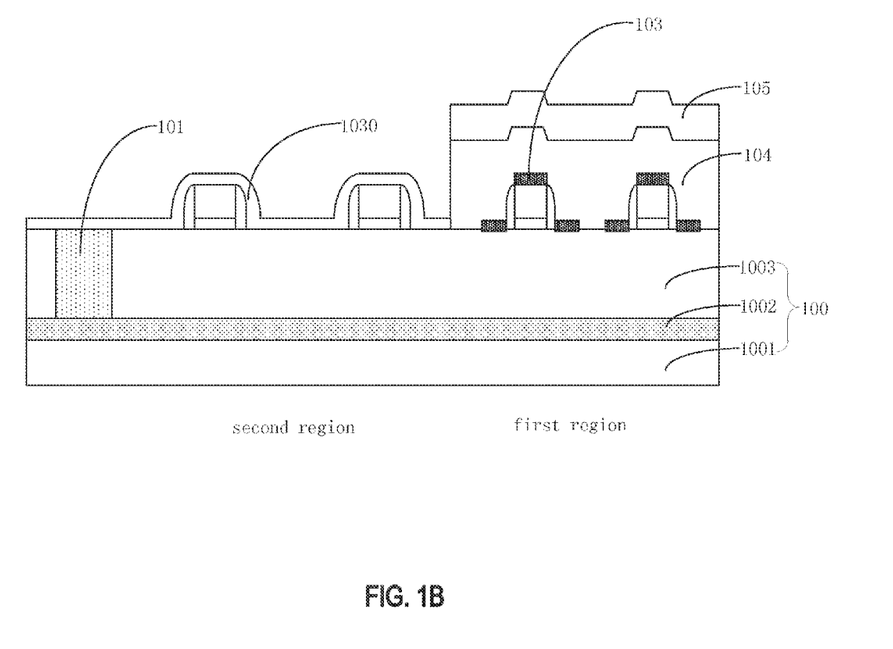
Figure 1C:
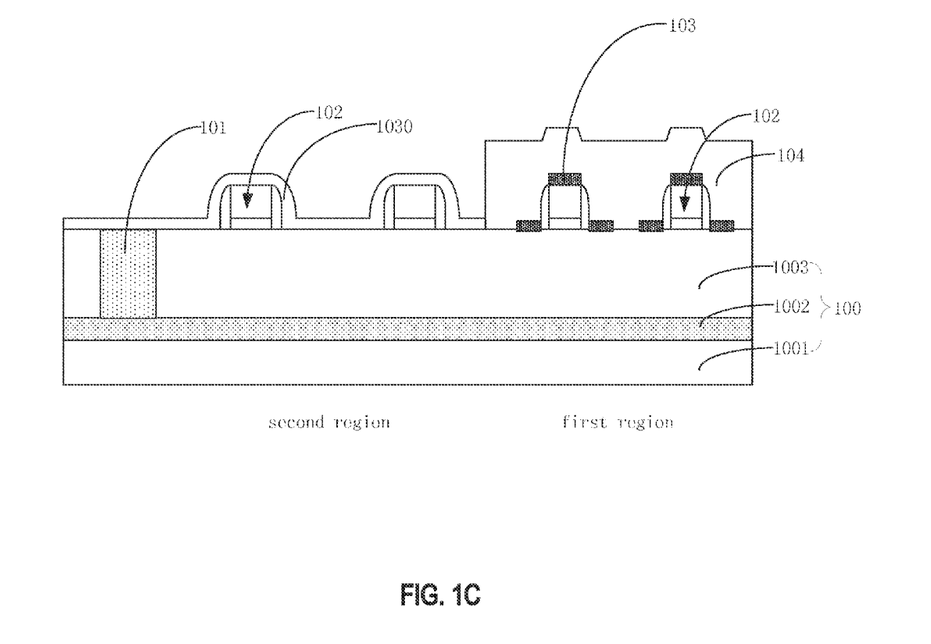
Figure 1D:
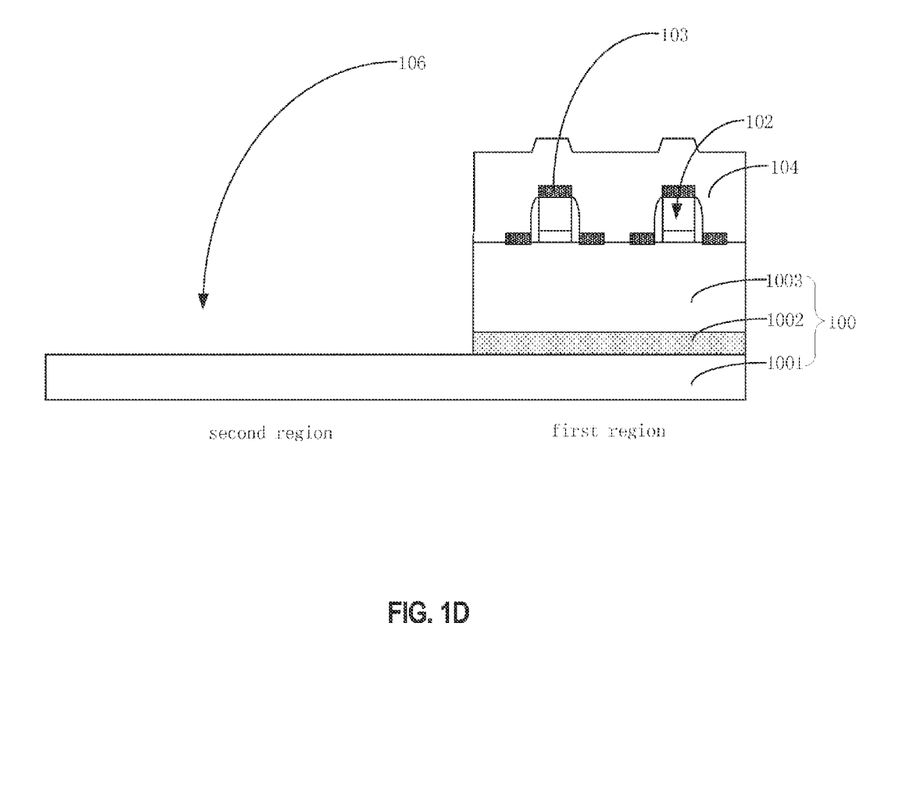
Figure 1E:
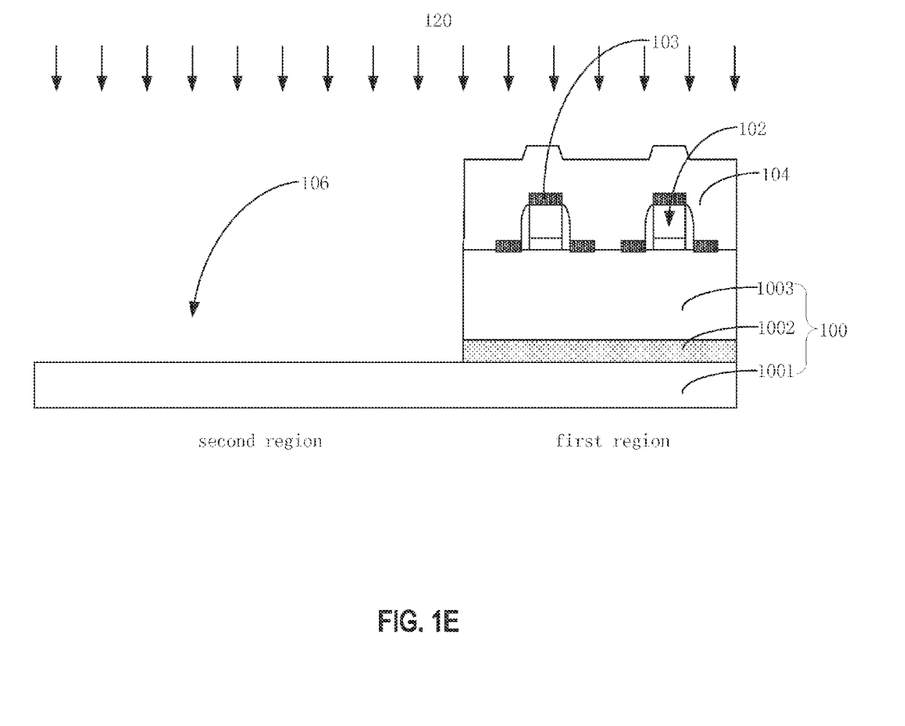
Figure 1F:
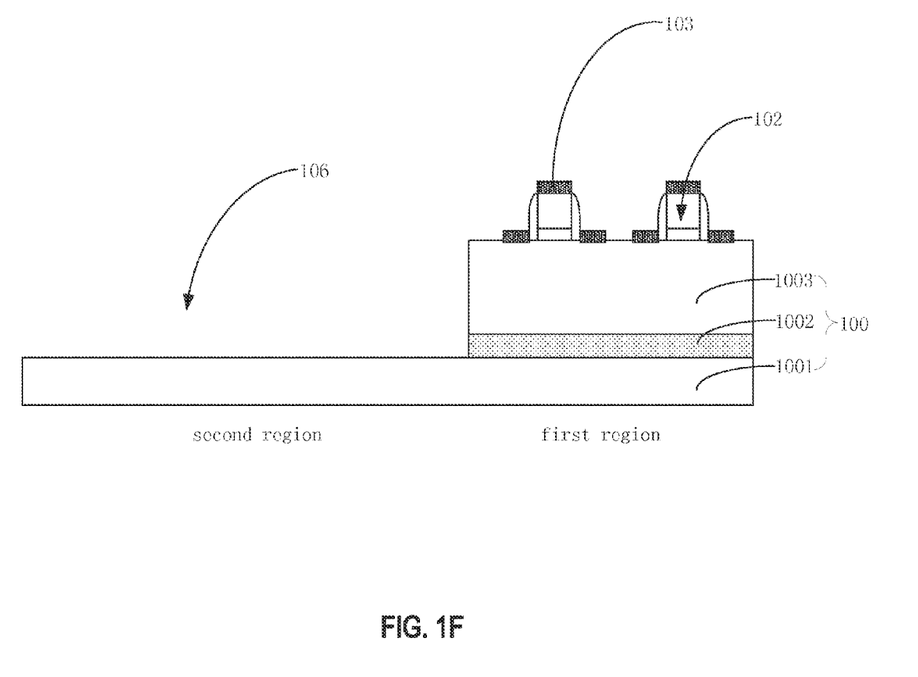
Figure 1G:
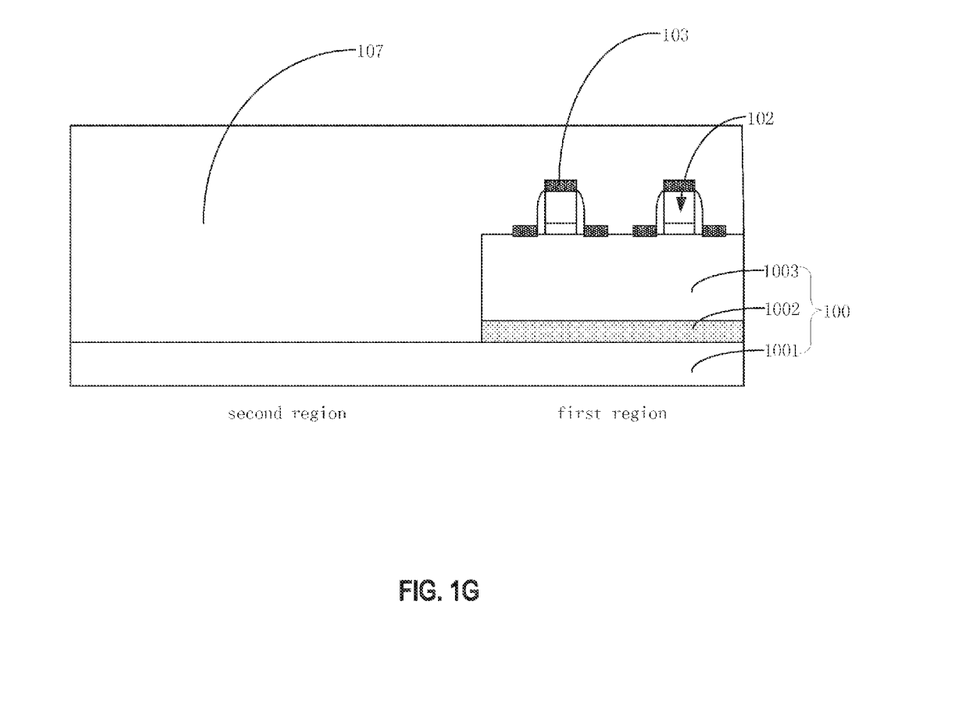
Figure 2:
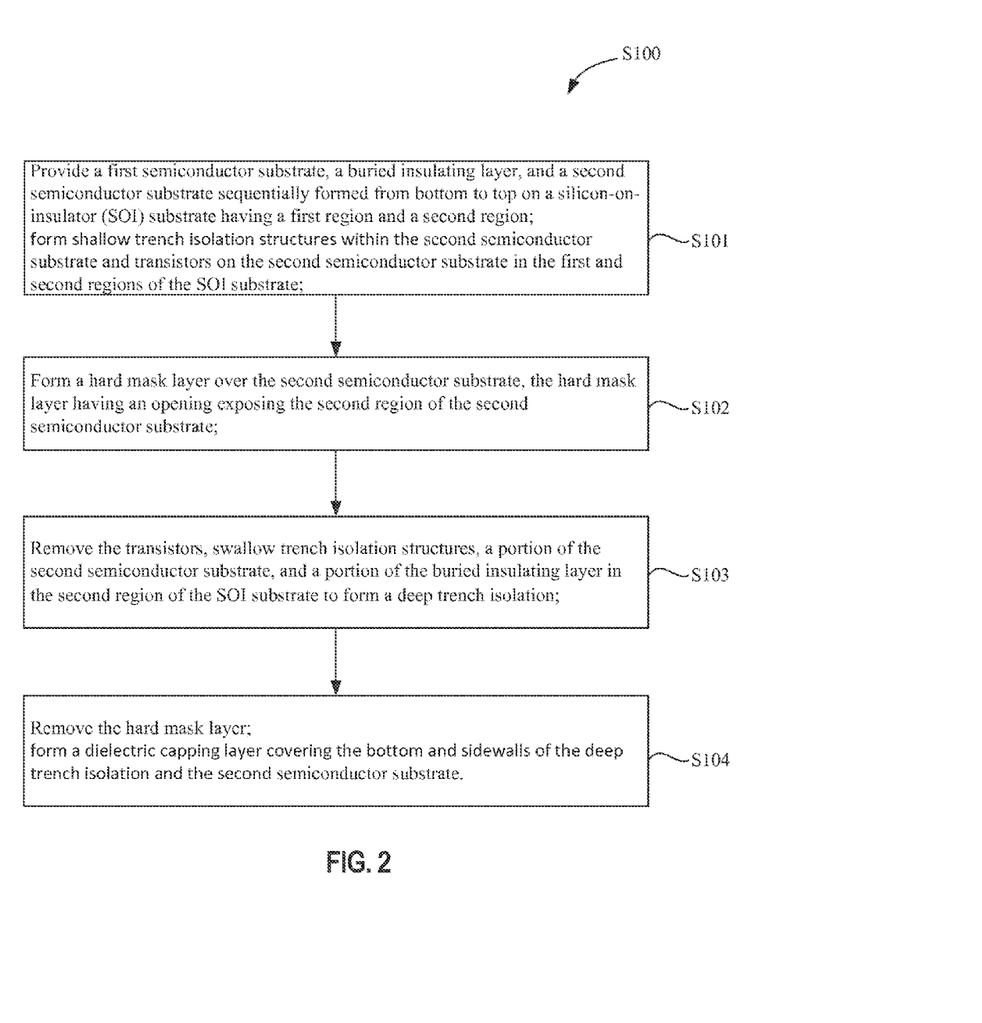
FIG. 2 a flow chart of a method of fabricating a semiconductor device according to an embodiment of the present invention.

Referring to FIGS. 1A-1G and FIG. 2, a method according to an embodiment of the present invention will be described. FIGS. 1A through 1G are cross-sectional views of intermediate stages in the manufacturing of a semiconductor device according to an embodiment of the present invention. FIG. 2 is a simplified flow chart of a method of manufacturing of a semiconductor device according to an embodiment of the present invention.

The method of manufacturing a semiconductor device according to an embodiment of the present invention can be used for manufacturing a semiconductor device or a device comprising a RF switch (e.g., a RF front-end module). The method may include:

At step A1: a silicon-on-insulator (SOI) substrate 100 having a first semiconductor substrate 1001, a buried insulating layer 1002, and a second semiconductor substrate 1003 stacked from bottom to the top, respectively, is provided. A multitude of shallow trench isolation (STI) structures are then formed in a first region and in a second region of the SOI substrate 100 (only one STI structure is shown in FIG. 1A). A multitude of transistors 102 is formed in the first and second regions of second semiconductor substrate 1003 device, as shown in FIG. 1A.

In an embodiment, buried insulating layer 1002 is a buried oxide layer. as used herein, first semiconductor substrate 1001 is referred to as a supporting substrate, and second semiconductor substrate 1001 is referred to as a semiconductor device layer.

In this step, transistors 102 each having a source, a drain, a gate, and a metal silicide 103 formed over the gate may be formed in the first region, as shown in FIG. 1A. In order to form the source, drain, gate, and metal silicide 103 over the gate, a shielded silicide block layer (SAB) 1030 is required to be formed over the second region of second semiconductor substrate 1003, as shown in FIG. 1A.

For illustration purposes, step A1 may include:

Step A101: providing silicon-on-insulator (SOI) substrate 100 having first semiconductor substrate 1001, buried insulating layer 1002, second semiconductor substrate 1003 stacked from bottom to top, respectively. Shallow trench isolator (STI) structures 101 are formed within second semiconductor substrate 1003 in the first and second regions of SOI substrate 100;

Step A102: forming a multitude of transistors 102 on second semiconductor substrate 1003 in the first and second regions of SOI substrate 100;

Step A103: forming a shielded silicide block layer 1030 over second semiconductor substrate 1003 in the second region; and Step A104: forming a source electrode, a drain electrode, a gate electrode, and a metal silicide layer 103 over the gate electrode in the first region of SOI substrate 100.

In an embodiment, transistors 102 may include different types of transistors, such as n-type transistors, p-type transistors, single-gate and double-gate transistors, and not limited to those transistor types. Further, step A1 may also include, in addition to forming a multitude of shallow trench isolation structures 101, other steps of forming other components.

At step A2: a hard mask layer 104 having an opening in the second region is formed over the second semiconductor substrate 1003. Hard mask layer 104 covers the first region of second semiconductor substrate 1003 and the opening of hard mask layer 104 exposes the second region, i.e., the opening of hard mask layer 104 exposes a surface of shielded silicide block layer 1030 which is disposed over the top surface of shallow trench isolation structure 101, gate electrodes, and sidewalls of the gate structures.

In an embodiment, hard mask layer 104 may be amorphous carbon or other materials suitable for use as a hard mask layer. In an embodiment, forming a hard mask layer may include:

Step A201: forming a hard mask material layer over second semiconductor substrate 1003; forming a photoresist layer 105 having an opening in the second region over the hard mask material layer; and etching the hard mask material layer using photoresist layer 105 as a mask to form hard mask layer 104, as shown in FIG. 1B.

Step A202: removing photoresist layer 105 by wet stripping, as shown in FIG. 1C. Photoresist layer 105 may be a negative photoresist or a positive photoresist. Any other suitable processes may be used besides the wet stripping method to remove photoresist layer 105.

At step A3: shielded silicide block layer 1030, transistors 102 including the gate electrodes and gate sidewalls, second semiconductor substrate 1003 and shallow trench isolation structures 101, and buried insulating layer 1002 that are exposed in the second region by the opening of hard mask layer 104 are removed to expose a surface of first semiconductor substrate 1001 in the second region for forming a deep trench isolation 106, as shown in FIG. 1D.

At step A4: after forming deep trench isolation 106, using hard mask layer 104 as a mask, an ion implantation is performed onto a region of first semiconductor substrate 1001 corresponding to deep trench isolation 106, as shown in FIG. 1E.

Referring to FIG. 1E, the ion implantation is indicated by arrows 120. The region of first semiconductor substrate 1001 corresponding to deep trench isolation 106 is referred to as a region of the deep trench isolation 106. Performing an ion implantation onto the deep trench isolation region can control isolation and trapping suppression to improve the device performance. The implanted ions may be argon (Ar), boron (B), or other suitable elements. In an embodiment, step A4 can be omitted.

At step A5: hard mask layer 104 is removed, as shown in FIG. 1F. Hard mask layer 104 can be removed using an ashing process or any other suitable processes. In an embodiment, an oxygen plasma ashing process is used to remove hard mask layer 104.

At step A6: a capping film 107 is formed to cover second semiconductor substrate 1003 (specifically, the first region of second semiconductor substrate 1003) and the bottom and sidewalls of deep trench isolation 106, as shown in FIG. 1G.

Obviously, shallow trench isolation structures (not shown) in second semiconductor substrate 1003, metal silicide 103, transistors 102 are covered by capping film 107. In an embodiment, capping film 103 may be silicon nitride (SiN) or other suitable materials. Capping film 107 may be formed by depositing a dielectric material layer followed by a planarization process. The planarization process may be a chemical mechanical polishing process or other suitable processes.

In an embodiment, deep isolation trench 106 and capping film 107 can provide excellent isolation to first semiconductor substrate 1001 located below buried insulating layer 1002 and transistors 102 (disposed in the first region) on second semiconductor substrate 1001 located above buried insulating layer 1002 and interconnect wires (the interconnect structure may be formed in subsequent processes). Thus, deep isolation trench 106 can significantly reduce substrate coupling and ensure linearity and resonant characteristics of the semiconductor device.

Various process steps may also be added to the above processes to complete the semiconductor device fabrication.

The method described above provides deep trench isolation 106 and capping film 107 that ensure a good isolation between first semiconductor substrate 1001 located below buried insulating layer 1002 and transistors 102 and interconnect wires disposed on second semiconductor substrate 1003 located above buried insulating layer 1002, reduce substrate coupling and improve the performance of the semiconductor device.

FIG. 2 is a flow chart of a method S100 for manufacturing a semiconductor device according to an embodiment of the present invention. Method S100 includes:

At block S101: a silicon-on-insulator (SOI) substrate having a first region and a second region is provided. A first semiconductor substrate, a buried insulating layer, and a second semiconductor substrate are sequentially formed on the silicon-on-insulator (SOI) substrate. A multitude of shallow trench isolation structures are formed in the first and second regions within the second semiconductor substrate, and a multitude of transistors are formed in the first and second regions of the second semiconductor substrate;

At block S102: a hard mask layer is formed over the second semiconductor substrate, the hard mask layer has an opening exposing the second region of the second semiconductor substrate;

At block S103: the transistors, swallow trench isolation structures, the exposed second region of the second semiconductor substrate, and the second region of the buried insulating layer are removed to form a deep trench isolation;

At block S104: the hard mask layer is removed. A dielectric capping layer is formed to cover the bottom and sidewalls of the deep trench isolation and the second semiconductor layer.

Second Embodiment

Figure 3:
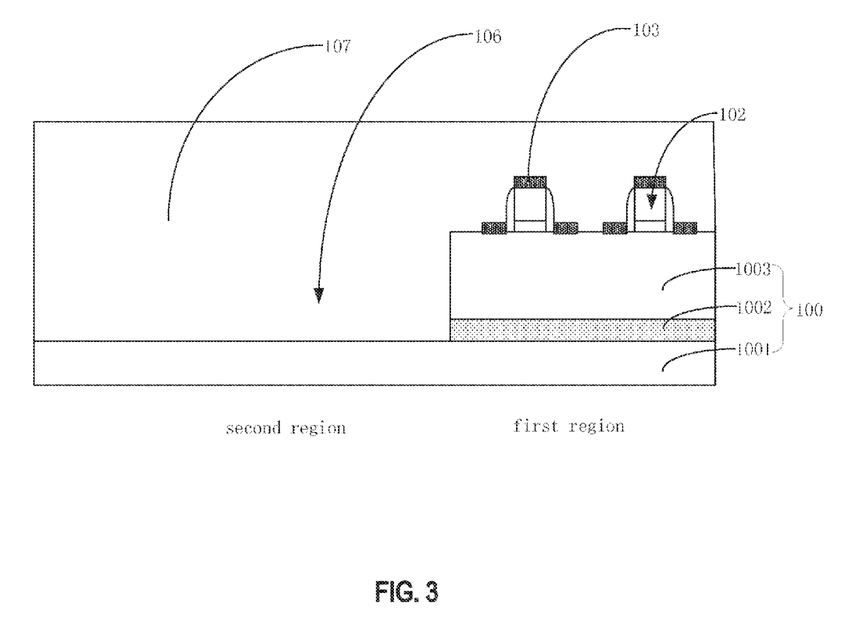
FIG. 3 is a simplified cross-sectional view of a semiconductor device structure according to another embodiment of the present invention.

Embodiments of the present invention provide a semiconductor device that may be made using method S100 described above. FIG. 3 is a cross-sectional view of a semiconductor device according to an embodiment of the present invention. As shown in FIG. 3, the semiconductor device includes a silicon-on-insulator (SOI) substrate 100. SOI substrate 100 includes a first semiconductor substrate 1001, a buried insulating layer 1002 and a second semiconductor substrate 1003 sequentially formed from bottom to top. The semiconductor device also includes a first region and a second region disposed in SOI substrate 100, a multitude of transistors 102 disposed on second semiconductor substrate 1003 in the first region and a deep trench isolation 106 on an exposed surface of first semiconductor substrate 1001 in the second region. The semiconductor device also includes a dielectric capping layer 107 covering the bottom and sidewalls of deep trench isolation 106. Dielectric capping layer 107 may be of silicon nitride or other suitable materials.

The semiconductor may also include a metal silicide 103 disposed on source/drain regions and gate electrodes of the transistors 102.

In an embodiment, the semiconductor may include an ion implanted layer at the bottom of deep trench isolation 106. The ion implanted layer may be doped with argon and boron ions.

The semiconductor device comprises deep trench isolation 106 and dielectric capping layer 107 that provide an efficient isolation between first semiconductor layer 1001 and transistors and interconnect wires (i.e., interconnect structure) disposed on semiconductor substrate 1003 above buried insulating layer 1002, thus, coupling between the substrates is significantly reduced and the performance of the semiconductor device is improved.

It is to be understood that the above described embodiments are intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method of forming a semiconductor device, the method comprising:
   providing a silicon-on-insulator (SOI) substrate having a first region and a second region, the SOI substrate including a first semiconductor substrate, a buried insulating layer, and a second semiconductor substrate sequentially formed thereon;
   forming a plurality of shallow trench isolation structures within the second semiconductor substrate in the first and second regions;
   forming a plurality of transistors on the second semiconductor substrate in the first and second regions;
   forming a hard mask layer over the second semiconductor substrate, the hard mask layer having an opening exposing a portion of the second semiconductor substrate in the second region;
   removing the transistors and shallow trench isolation structures disposed in the exposed portion of the second semiconductor substrate to form a deep trench isolation using the hard mask layer as a mask;
   removing the hard mask layer; and
   forming a dielectric capping layer covering a bottom and sidewalls of the deep trench isolation.

2. The method of claim 1, further comprising:
   forming a metal silicide layer over source/drain regions and gate electrodes of the transistors prior to forming the hard mask layer.

3. The method of claim 2, wherein providing the SOI substrate comprises:
   sequentially forming the first semiconductor substrate, the buried insulating layer over the first semiconductor substrate, and the second semiconductor substrate over the buried insulating layer;
   forming the plurality of transistors on the second semiconductor substrate in the first and second regions;
   forming a metal silicide blocking layer covering the second region of the second semiconductor substrate; and
   forming a metal silicide layer over the gate electrodes and the source/drain regions disposed in the first region.

4. The method of claim 1, wherein forming the hard mask layer comprises:
   forming a hard mask material layer over the second semiconductor substrate;
   forming a photoresist layer over the hard mask material layer;
   patterning the photoresist layer to form an opening over the second region;
   etching the hard mask material layer using the patterned layer as a mask; and
   removing the patterned photoresist layer.

5. The method of claim 1, wherein the hard mask layer comprises amorphous carbon.

6. The method of claim 5, wherein the dielectric capping layer comprises silicon nitride.

7. The method of claim 1, wherein removing the hard mask layer comprises an ashing process.

8. The method of claim 7, wherein the ashing process is an oxygen plasma ashing process.

9. The method of claim 1, further comprising, between forming the deep trench isolation and the dielectric capping layer:
   performing an ion implantation into a region corresponding to the deep trench isolation.

10. The method of claim 9, wherein the ion implantation comprises argon and boron ions.

* * * * *